| United States Patent [19] | [11] Patent Number: 4,661,982 |
|---|---|
| Kitazato et al. | [45] Date of Patent: Apr. 28, 1987 |

[54] DIGITAL GRAPHIC EQUALIZER

[75] Inventors: Naohisa Kitazato, Tokyo; Osamu Hamada, Kanagawa, both of Japan

[73] Assignee: Sony Corporation, Tokyo, Japan

[21] Appl. No.: 715,949

[22] Filed: Mar. 25, 1985

[30] Foreign Application Priority Data

Mar. 24, 1984 [JP] Japan .................................. 59-56874

[51] Int. Cl.⁴ ............................................ H03G 5/00
[52] U.S. Cl. ....................................... 381/103; 381/98
[58] Field of Search ...................... 381/103, 1, 98, 101, 381/102; 364/570, 571, 572, 576, 724, 381; 333/28 R

[56] References Cited

U.S. PATENT DOCUMENTS 4,340,780 7/1982 Odlen ................................. 381/103
4,458,362 7/1984 Berkovitz et al. ................... 381/103

FOREIGN PATENT DOCUMENTS 2068678 8/1981 United Kingdom ................. 381/103

OTHER PUBLICATIONS

Lancaster, TTL Cookbook, 1980, pp. 280–282.
Chamberlin, Musical Applications of Microprocessors, 1980, pp. 309, 446, 447.

Primary Examiner—Forester W. Isen
Attorney, Agent, or Firm—Lewis H. Eslinger; Alvin Sinderbrand

[57] ABSTRACT

A digital graphic equalizer includes a pulse-sequence generator for generating a sequence of pulse signals, a first digital signal processor for filtering the pulse signals to produce a filtered signal, a digital-to-analog converter responsive to the filtered signal for producing a calibrating signal, and a loudspeaker responsive to the calibrating signal for propagating a calibrating sound in a listening environment, the frequency characteristics of the calibrating sound being subject to modification by the listening environment. A detector detects the calibrating sound as propagated in the listening environment and produces a detection signal representative thereof. An analog-to-digital converter is responsive to the detection signal for producing a digital signal corresponding thereto, and a second digital signal processor is responsive to the digital signal for producing a plurality of frequency-divided signals. A spectrum analyzer is responsive to the frequency-divided signals for analyzing the frequency characteristics of the calibrating sound as propagated in the listening environment and producing a compensating signal adapted to compensate for the modification by the listening environment of the frequency characteristics of the calibrating sound.

12 Claims, 6 Drawing Figures

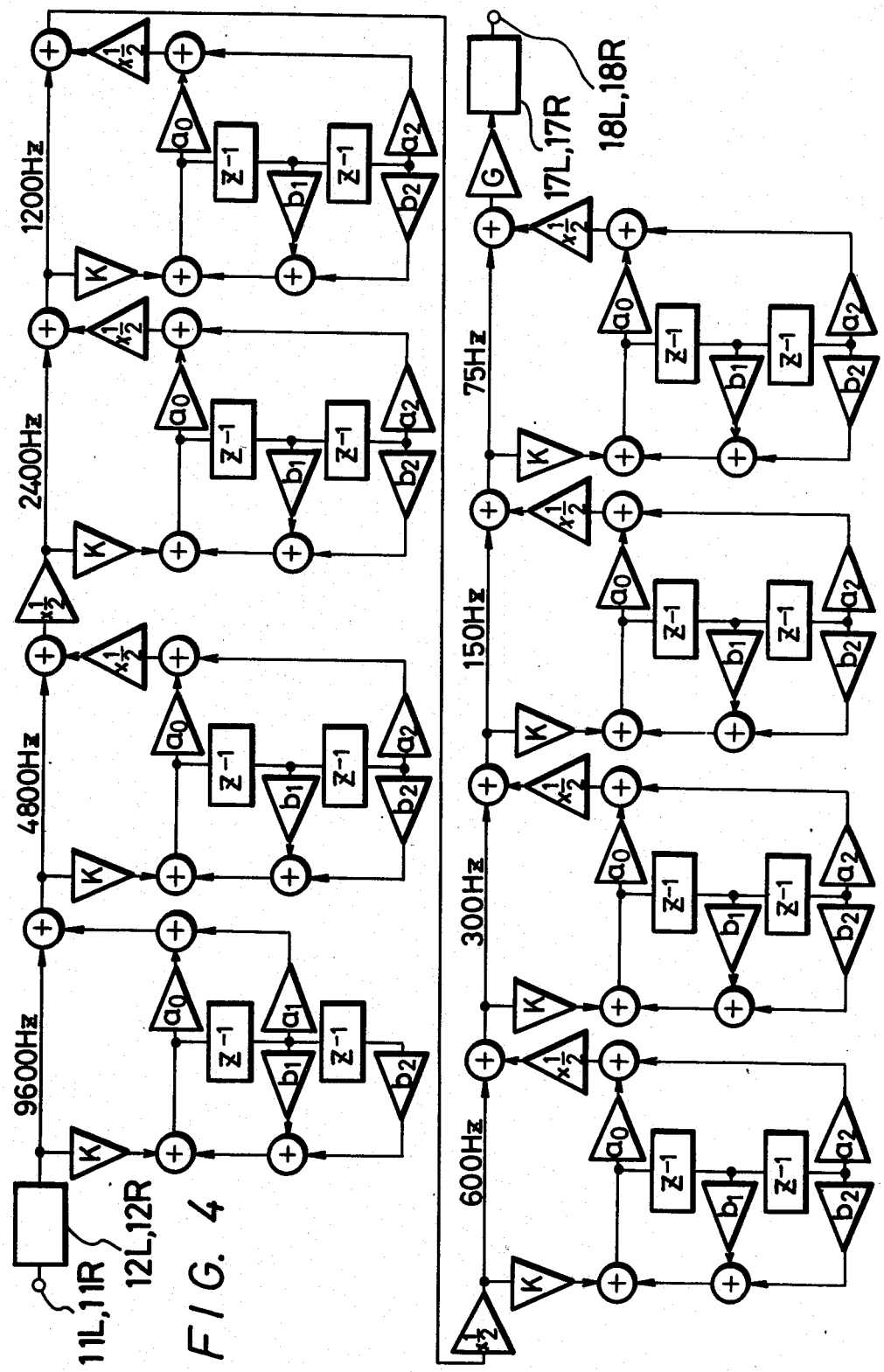
F I G. 4

DIGITAL GRAPHIC EQUALIZER

BACKGROUND OF THE INVENTION

1. Field of the Invention

This invention relates generally to a digital graphic equalizer and, more particularly, to a novel and inexpensive digital graphic equalizer that compensates more conveniently and efficiently than prior-art graphic equalizers for distortions of the frequency characteristics of sound by the listening environment in which the sound is propagated.

2. Description of the Prior Art

When a PCM (pulse code modulated) recording or other source of an audio signal is employed to produce sound (music for example), it is desirable that the frequency characteristic of the sound as heard by a listener in a particular listening environment be "flat"—i.e., free of distortion due to selective absorption or attenuation of the sound at different frequencies by the listening environment.

Digital graphic equalizers for compensating for distortions of the frequency characteristics of sound by the listening environment are known. However, in the prior art, a special noise generator, spectrum analyzer, etc., are necessary for calibration. The equipment required is bulky, complex and expensive, and the manner of employing it is cumbersome and inconvenient.

OBJECTS AND SUMMARY OF THE INVENTION

An object of the invention is to remedy the major problems of prior digital graphic equalizers and, in particular, to provide an improved digital graphic equalizer including a digital signal processor for synthesizing a pink noise and performing a spectrum analysis.

Another object of the invention is to provide a digital graphic equalizer that can be easily calibrated in a plurality of listening environments to compensate for distortions of sound due to selective absorption or attenuation thereof at different frequencies and that thereafter can be configured in accordance with a selected one of the calibrations by the touch of a button, so that audio apparatus in which the graphic equalizer is incorporated can conveniently be moved from one such environment to another while always providing an optimum frequency response.

According to one aspect of the present invention, there is provided a digital graphic equalizer comprising: a pulse-sequence generator for generating a sequence of pulse signals; first digital signal processing means for filtering the pulse signals to produce a filtered signal; digital-to-analog converter means responsive to the filtered signal for producing a calibrating signal; loudspeaker means responsive to the calibrating signal for propagating a calibrating sound in a listening environment, the frequency characteristics of the calibrating sound being subject to modification by the listening environment; means for detecting the calibrating sound as propagated in the listening environment and producing a detection signal representative thereof; analog-to-digital converter means responsive to the detection signal for producing a digital signal corresponding thereto; second digital signal processing means responsive to the digital signal for producing a plurality of frequency-divided signals; and spectrum analyzer means responsive to the frequency-divided signals for analyzing the frequency characteristics of the calibrating sound as propagated in the listening environment and producing a compensating signal adapted to compensate for the modification thereof.

BRIEF DESCRIPTION OF THE DRAWINGS

A better understanding of the objects, features and advantages of the invention can be gained from the following detailed description of the preferred embodiments thereof, in conjunction with the appended figures of the drawings, wherei:

FIGS. 4 to 6 are circuit block diagrams respectively showing different parts of the apparatus of FIG. 3.

DESCRIPTION OF THE PREFERRED EMBODIMENT

Figure 1:
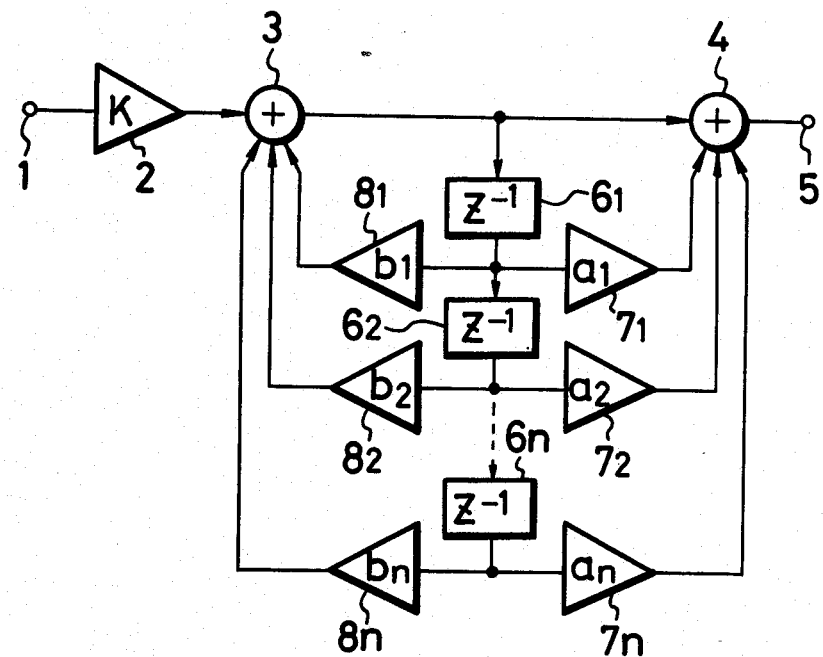
FIG. 1 is a circuit block diagram of a prior-art digital graphic eqqualizer.

FIG. 1 illustrates an example of a prior-art digital graphic equalizer. A digital audio signal supplied to an input terminal 1 is delivered through a multiplier 2 having a multiplication coefficient K, an input adder 3 and an output adder 4 to an output terminal 5. The signal between the input and output adders 3 and 4 is supplied to a circuit formed by connecting in cascade delay circuits $6_1, 6_2 \ldots 6_n$ each of which has a delay amount $Z^{-1}$. The outputs from these delay circuits $6_1$ to $6_n$ are respectively supplied through multipliers $7_1, 7_2 \ldots 7_n$ having multiplication coefficients $a_1, a_2 \ldots a_n$ to the output adder 4. The outputs from the delay circuits $6_1, 6_2 \ldots 6_n$ are respectively supplied through multipliers $8_1, 8_2 \ldots 8_n$ having multiplication coefficients $b_1, b_2 \ldots b_n$ to the input adder 3.

In this circuit arrangement, the transfer function from the input terminal 1 to the output terminal 5 is expressed as $$H(Z) = K \cdot \frac{1 + \sum_{i=1}^{n} a_i Z^{-1}}{1 - \sum_{i=1}^{n} b_i Z^{-1}} \qquad (1)$$

Various characteristics of desired filters such as a low-pass filter, a high-pass filter and a band-pass filter can be obtained by varying the coefficients K, $a_1$ to $a_n$ and $b_1$ to $b_n$.

Figure 2:
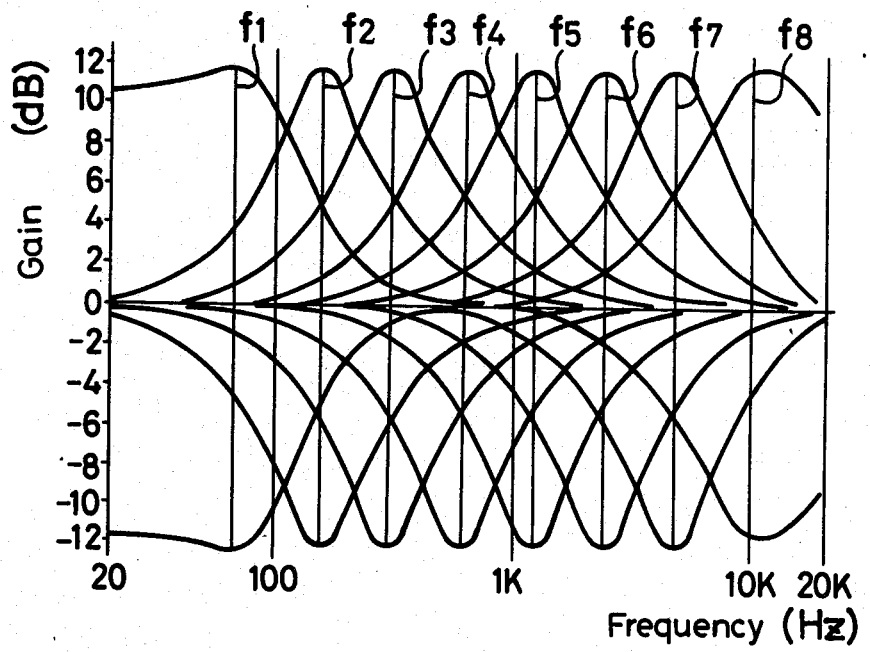
FIG. 2 is a graph showing a control characteristic of the digital graphic equalizer of FIG. 1.

As a result, if the circuit of FIG. 1 is connected in cascade in a plurality of stages (eight for example), and the characteristics of the respective circuits are such that, as FIG. 2 shows, peak characteristics are obtained at desired resonance frequencies $f_1$ to $f_8$, and the levels at the resonance frequencies $f_1$ to $f_8$ can be adjusted independently, then a so-called digital graphic equalizer can be formed.

In such a digital graphic equalizer, since the signal processing is carried out in a digital fashion, it is accomplished accurately and easily and without degrading tone quality, etc. This is in contrast to analog processing, which degrades the processed signal in various ways.

The conventional digital graphic equalizer described above can be used to make the frequency characteristics of the sound "flat" in a particular listening environment such as a room or vehicle in which audio apparatus is installed. Since the interior spaces of a car, a living room, etc., are different in acoustic characteristics, they respectively require different compensations by the equalizer.

Therefore, in order to employ a digital graphic equalizer effectively, the acoustic characteristics of the listening environment in which the apparatus is installed must first be measured, a sound field compensating characteristic for the listening environment must then be determined, and the compensating characteristic must then be employed to set the operating parameters of the graphic equalizer.

In order to measure the acoustic characteristics of the listening environment, a so-called pink noise is generated for use as a calibrating sound. A pink noise is defined as a noise of which the intensity is inversely proportional to the frequency, so that the energy per octave is constant. In practice, this is a noise of which the intensity level is reduced by 3 dB/octave. The pink noise is emitted from a loudspeaker in the listening environment and detected by a nearby microphone. The detected signal is analyzed by a spectrum analyzer, so that a compensating signal can be derived.

This procedure is cumbersome. Moreover, the apparatus includes a pink noise generator, a spectrum analyzer, etc., and is bulky and complex. It is troublesome to set the measured compensating parameters into the digital graphic equalizer, and the control circuit by which this is accomplished is complicated.

Figure 3:
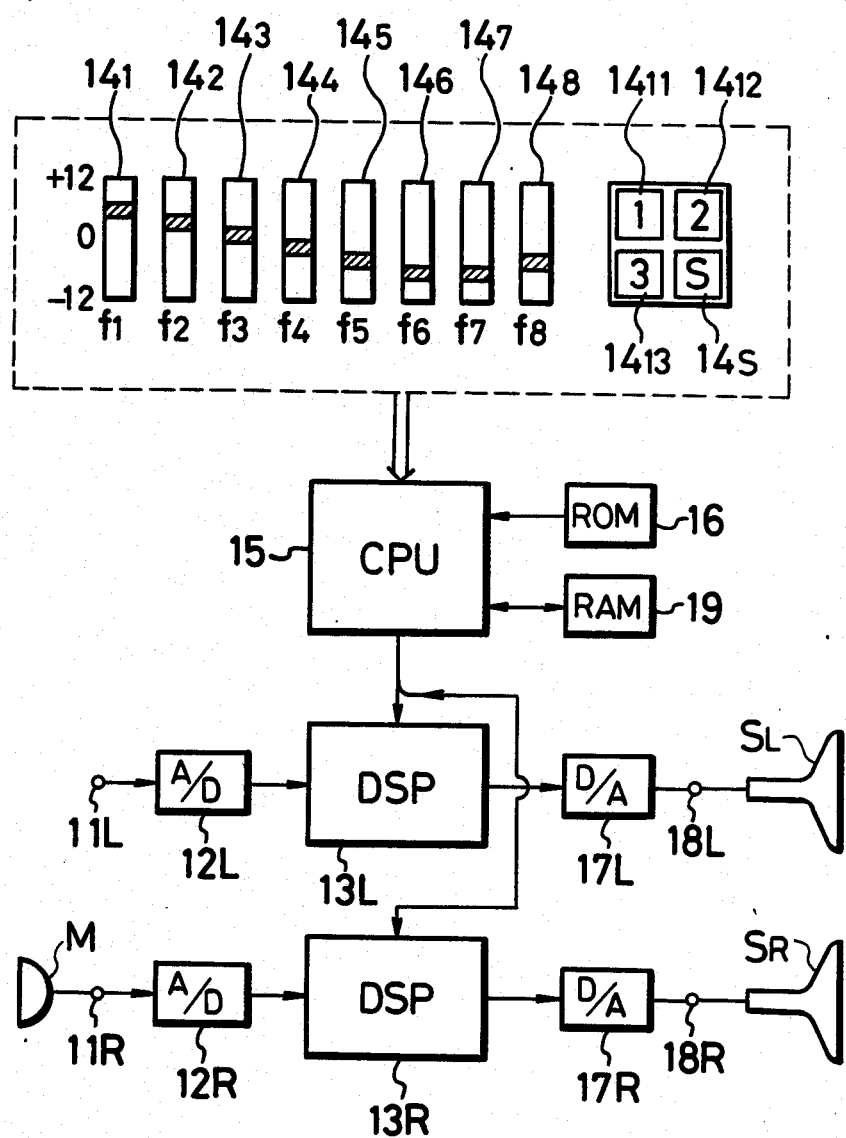
FIG. 3 is a circuit block diagram of a preferred embodiment of a digital, graphic equalizer according to the present invention.

FIG. 3 schematically illustrates a preferred embodiment of a digital graphic equalizer according to the present invention. In FIG. 3, left and right stereophonic audio signals applied to input terminals 11L and 11R are respectively supplied to A/D (analog-to-digital) converters 12L and 12R and the digitized signals therefrom are respectively supplied to digital signal processing units (hereinafter referred to simply as DSPs) 13L and 13R. Each of the DSPs 13L and 13R incorporates therein a multiplier, an adder, a shift register, etc. (not shown).

A digital signal indicative of measured values of adjustments of respective volumes $14_1, 14_2 \ldots 14_8$ at corresponding frequencies $f_1, f_2 \ldots f_8$ is supplied to a host CPU (central processing unit) 15. In accordance with the signals representing the volumes $14_1$ to $14_8$, the coefficients K, a and b necessary to achieve a flat frequency response are retrieved from a ROM (read-only memory) 16 which serves as a coefficient table, and the coefficients are supplied to the DSPs 13L and 13R, respectively.

In each of the DSPs 13L and 13R, calculations are carried out in accordance with the coefficients supplied thereto. The DSPs 13L and 13R may each include a portion as shown in FIG. 4. The circuit of FIG. 4 comprises eight stages, in which frequency characteristics are compensated with signals of 9600 Hz, 4800 Hz, 2400 Hz, 1200 Hz, 600 Hz, 300 Hz, 150 Hz and 75 Hz being supplied as inputs to the respective stages. The compensating levels are controlled by the coefficients K, a and b determined in accordance with the volumes $14_1$ to $14_8$.

As FIG. 3 shows, the output signals from the DSPs 13L and 13R are respectively supplied to D/A (digital-to-analog) converters 17L and 17R, and the converted analog signals therefrom are respectively delivered to output terminals 18L and 18R.

A RAM (random-access memory) 19 is provided in association with the host CPU 15, and also selector means including push buttons $14_{11}$ to $14_{13}$ for indicating a particular room, etc., in which a calibration is to be performed. Each push button selects a different address in the RAM 19. A push button 14S is provided for initiating calibration. When the push button 14S is depressed, the calibration mode for generating, detecting and analyzing the sound field and producing a compensating signal adapted to compensate for distortions of the sound field by a particular listening environment is established in the respective DSPs 13L and 13R.

Figures 5, 6:
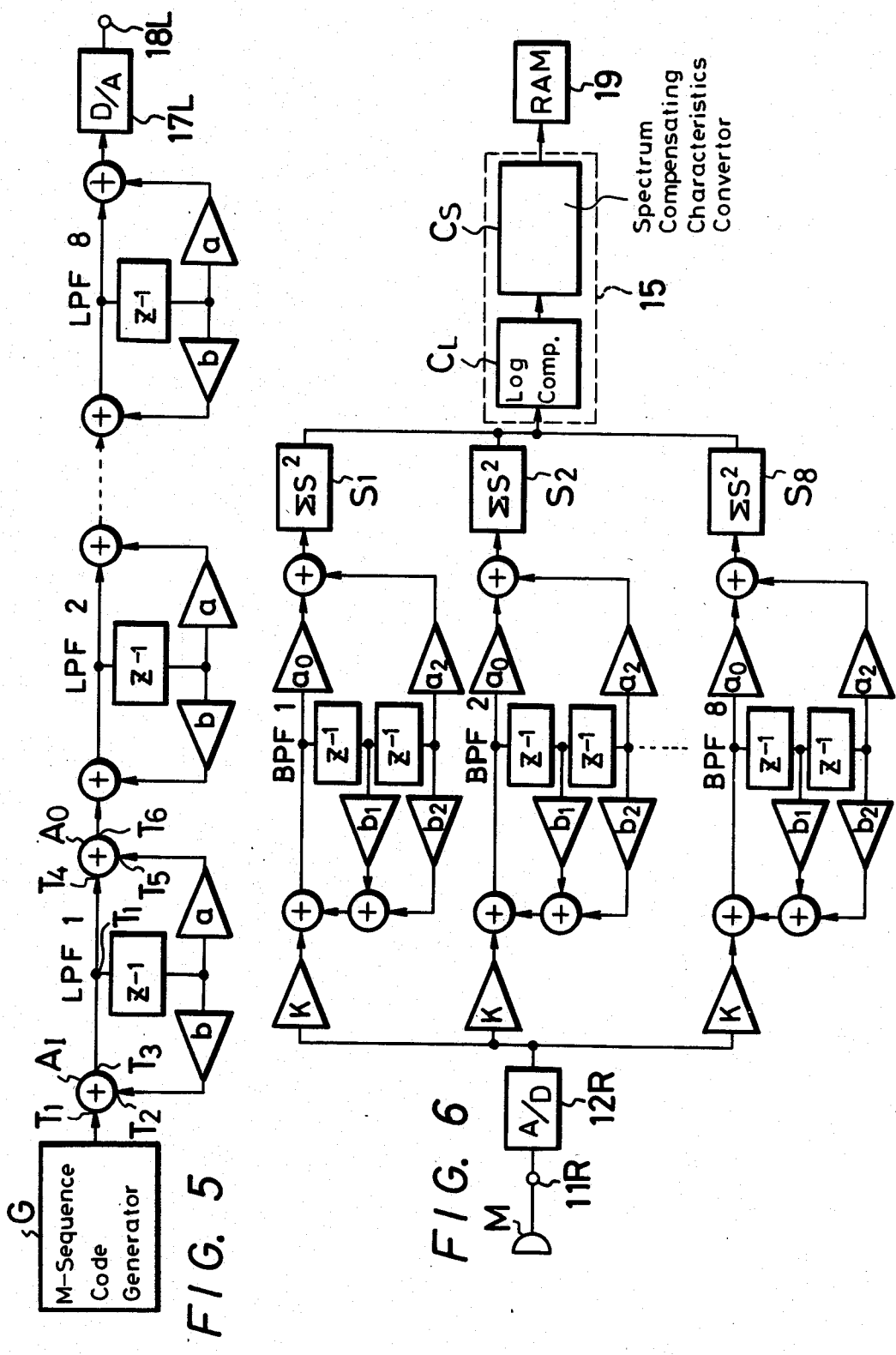

In the sound field characteristic measuring mode (calibration mode), the first DSP 13L synthesizes a pink noise. FIG. 5 is a circuit block diagram showing how this is accomplished. In FIG. 5, an M-sequence code generator G generates a signal representing a so-called M-sequence code noise, which changes with time in a prescribed way during a predetermined interval. The signal from the code generator G is supplied to a filter the frequency response of which is $-3$dB/octave, whereby a pink noise is synthesized. The M-sequence code generator G is operated to synthesize the pink noise by controlling a shift register (not shown) of the first DSP 13L and a filter having a frequency response of $-3$dB/octave is formed by connecting, for example, eight low-pass filter stages in cascade.

Each low-pass filter stage, as exemplified by LPF 1 in FIG. 5, comprises an input adder such as $A_I$ having first and second input terminals $T_1$ and $T_2$, respectively, and an output terminal $T_3$. The first input terminal $T_1$ is supplied with the output of the M-sequence code generator G. The filter stage LPF 1 further comprises an output adder $A_O$ having first and second input terminals $T_4$ and $T_5$, respectively, and an output terminal $T_6$. Delay circuit means $Z^{-1}$, a, b is provided having an input terminal $T_7$ and two output multiplier circuits b and a, the input terminal $T_7$ being connected to the output terminal $T_3$ of the input adder $A_I$ and the output circuits b and a being respectively connected to the second input terminals $T_2$ and $T_5$ of the input and output adders $A_I$ and $A_O$.

The pink noise signal synthesized by the circuit of FIG. 5 is supplied to the D/A converter 17L and converted to analog form. This analog signal is supplied through an output terminal 18L to a loudspeaker $S_L$ (FIG. 3) which converts it to a sound wave and propagates the sound wave within the listening environment.

The second DSP 13R carries out the spectrum analysis. FIG. 6 is a circuit block diagram of the circuit for performing the analysis. The signal produced by a microphone M (see also FIG. 3) in response to the sound wave emitted by the loudspeaker $S_L$ is supplied through the input terminal 11R to the A/D converter 12R and converted to a digital audio signal. The digital audio signal is supplied to the second DSP 13R (FIG. 3).

In the DSP 13R, band-pass filters $BPF_1$, $BPF_2 \ldots BPF_8$ (FIG. 6) with band-pass frequencies respectively centered on the frequencies $f_1$ to $f_8$ (FIG. 2 or 4) are connected in parallel to one another. The digital outputs S from these band-pass filters are respectively squared to produce values $S^2$ and then summed by circuits $S_1$, $S_2 \ldots S_8$. Thus even though the digital input data may include both positive and negative values, exclusively positive output values are obtained. The multiplication is carried out by using the shift register, adder, etc., incorporated in the DSP 13R. Multiplication and addition algorithms are known to those skilled in the art and need not be described herein.

When one of the calculated values reaches a predetermined magnitude, all calculations are stopped, and each of the values at that time is detected. The values correspond to the acoustic characteristic of the listening environment where the loudspeaker $S_L$ and the microphone M are located.

These values are supplied to the host CPU 15, which performs a logarithmic compression, as indicated at $C_L$, and a spectrum compensating characteristic conversion, as indicated at $C_S$. The converted values correspond to the volumes $14_1$ to $14_8$ and are written into the RAM 19 at the address selected by one of the push buttons $14_{11}$ to $14_{13}$.

In this manner the apparatus is calibrated for a particular listening environment, for example a living room. The process can be repeated to calibrate the apparatus for a different listening environment, for example a car. The calibration process is the same in each case except that in one case the push button $14_{11}$ is pressed and in the other case the push button $14_{12}$ is pressed, for example. In the preferred embodiment of FIG. 3, the apparatus can be calibrated for up to three listening environments, so that thereafter the apparatus can be moved from one environment to another and with only the touch of a button and without further calibration will always produce sound with a flat frequency response, regardless of the different acoustic characteristics of the three listening environments.

Specifically, when one of the push buttons $14_{11}$ to $14_{13}$ is depressed next, the values previously written into the RAM 19 at the address specified by the depressed push button are read out therefrom and used to retrieve the appropriate coefficients from the coefficient table in the ROM 16. The coefficients derived therefrom are set into the DSPs 13L and 13R, and the DSPs 13L and 13R carry out the graphic equalizer operation in accordance therewith.

Since the DSPs 13L and 13R are employed both to synthesize the pink noise and to carry out the spectrum analysis, it is possible to measure the acoustic characteristics of the listening environment without providing any special or new equipment. Further, the compensating characteristic is automatically set into the RAM 19 and subsequently read out therefrom thereby to carry out the sound field compensation with maximum ease and efficiency from the standpoint of a user of the apparatus. Since, for example, the sound field compensating characteristic of the interior space of a vehicle is written into the RAM 19 at an address selected by the push button $14_{11}$ and the sound field compensating characteristic of a living room is written into the RAM 19 at an address selected by the push button $14_{12}$, it is possible to obtain the desired compensating characteristic by depressing only the push button $14_{11}$ or $14_{12}$ as required. Moreover, as indicated above, the third push button $14_{13}$ can be used to calibrate the apparatus in a third listening environment. This greatly enhances the utility of the digital graphic equalizer.

Further, the signal processing is all carried out digitally, so that control by the digital graphic equalizer is accurate. Since the signal processing of the graphic equalizer itself, the pink noise synthesis and the spectrum analysis are all carried out by the same hardware, the circuitry can be made small and simple. In addition, since the digital graphic equalizer of the invention is small and inexpensive to manufacture, and since the signal processing is governed by software, the digital graphic equalizer of the invention can be designed with great flexibility and is free of the need for adjustment in mass-production, etc.

Thus there is provided in accordance with the invention a novel and highly-effective digital graphic equalizer that compensates more conveniently and efficiently than prior-art equalizers for distortion of the frequency response of sound by the listening environment in which the sound is propagated.

Many modifications of the preferred embodiment of the digital graphic equalizer disclosed herein will readily occur to those skilled in the art upon consideration of this disclosure. For example, provision may readily by made for compensation in more than three listening environments by adding additional push buttons and providing adequate RAM capacity. Also, the particular frequencies $f_1$ through $f_8$ and the number of such frequencies may be varied, as those skilled in the art will readily understand. Accordingly, the invention is to be construed as including all structure that is within the scope of the appended claims.

We claim:

1. A digital graphic equalizer comprising:
   first and second digital signal processing means operable in a first mode for respectively equalizing two stereo related digital audio signals;
   a pulse-sequence generator for generating a sequence of pulse signals;
   calibration mode means for setting a second mode, which configures said first digital signal processing means for filtering said pulse signals to produce a filtered signal;
   digital-to-analog converter means responsive to said filtered signal for producing a calibrating signal;
   loudspeaker means responsive to said calibrating signal for propagating a calibrating sound in a listening environment, the frequency characteristics of said calibrating sound being subject to modification by said listening environment;
   means for detecting said calibrating sound as propagated in said listening environment and producing a detection signal representative thereof;
   analog-to-digital converter means responsive to said detection signal for producing a digital signal corresponding thereto;
   said calibration mode means also configuring said second digital signal processing means to respond to said digital signal to produce a plurality of frequency-divided signals when said second mode is set, and to
   spectrum analyze said frequency-divided signals to determine the frequency characteristics of the calibrating sound as modified in said listening environment and produce a compensating signal adapted to compensate for said modification.

2. A digital graphic equalizer according to claim 1; in which said calibrating sound has a frequency characteristic which rolls off at $-3$ dB/octave.

3. A digital graphic equalizer according to claim 1; in which said calibrating sound comprises a pink noise.

4. A digital graphic equalizer according to claim 1; in which said pulse-sequence generator comprises an M-sequence code generator.

5. A digital graphic equalizer according to claim 4; in which said first digital signal processing means comprises cascade-connected low-pass filters when said second mode is set.

6. A digital graphic equalizer according to claim 5; in which each of said low-pass filters comprises:
- an input adder having first and second input terminals and an output terminal, the first input terminal being supplied with the output of either said M-sequence code generator or the output of a previous filter in said cascade of filters;
- an output adder having first and second input terminals and an output terminal; and
- delay circuit means having an input terminal and two output circuits, the input terminal of said delay circuit means being connected to the output terminal of said input adder and the output circuits being respectively connected to the second input terminals of said input and output adders.

7. A digital graphic equalizer according to claim 6; wherein said two output circuits comprise a pair of multipliers.

8. A digital graphic equalizer according to claim 1; in which said second digital signal processing means includes a logarithmic compressor when said second mode is set.

9. A digital graphic equalizer according to claim 1; further comprising memory means for storing said compensating signal.

10. A digital graphic equalizer according to claim 9; wherein said memory means comprises a random-access memory.

11. A digital graphic equalizer according to claim 9; wherein said memory means has separate addresses for respectively storing separate compensating signals respectively corresponding to different listening environments, further comprising selector means for associating a particular address with a particular listening environment, whereby said digital graphic equalizer can be separately calibrated for said different listening environments.

12. A digital graphic equalizer according to claim 1; further comprising read-only memory means for storing coefficients corresponding to said compensating signal and adapted to adjust operating parameters of said first and second signal processing means in accordance therewith.

* * * * *